United States Patent [19]
Kitano et al.

[11] Patent Number: 6,049,128
[45] Date of Patent: Apr. 11, 2000

[54] SEMICONDUCTOR DEVICE

[75] Inventors: Makoto Kitano, Tsuchiura; Ryuji Kohno, Ibaraki-ken; Naotaka Tanaka, Kodaira; Akihiro Yaguchi; Tetsuo Kumazawa, both of Ibaraki-ken; Ichiro Anjoh, Koganei; Hideki Tanaka, Sagamihara; Asao Nishimura, Kokubunji; Shuji Eguchi, Ibaraki-ken; Akira Nagai, Hitachi; Mamoru Mita, Hitachi, all of Japan

[73] Assignee: Hitachi, Ltd., Tokyo, Japan

[21] Appl. No.: 08/820,631

[22] Filed: Mar. 19, 1997

[30] Foreign Application Priority Data

Mar. 19, 1996 [JP] Japan ................................. 8-062482

[51] Int. Cl.⁷ ............................ H01L 23/48; H01L 23/52; H01L 29/40; H01L 23/34
[52] U.S. Cl. ......................... 257/737; 257/777; 257/719; 257/783; 228/180.22
[58] Field of Search .................................. 257/737, 738, 257/777, 778, 719, 783; 228/180.22

[56] References Cited

U.S. PATENT DOCUMENTS 5,576,630  11/1996  Fujita .................................... 324/760
5,737,191  4/1998  Horiuchi et al. ........................ 257/783

FOREIGN PATENT DOCUMENTS 210371  2/1987  European Pat. Off. ............... 257/778
6-504408  5/1994  Japan .
6-224259  8/1994  Japan .
6-302604  10/1994  Japan .

OTHER PUBLICATIONS

Transaction of the Japan Society of Mechanical Engineers (JSME), vol. 50, No. 505, Chapter A, p. 1709.

Kitano et al., "Thermal Fatique S Strength Estimation of Solder Joints of Surface Mount IC Packages", Soldering & Surface Mount Technology, No. 2, Jun. 1989.

Primary Examiner—Mahshid D. Saadat
Assistant Examiner—Jhihan B Clark
Attorney, Agent, or Firm—Antonelli, Terry, Stout & Kraus, LLP

[57] ABSTRACT

A semiconductor device, is provided will semiconductor chips having a plurality of electrodes for external connection, elastomer resin portions formed of an elastomer resin, which are bonded to the semiconductor chip excepting at least some of the plurality of electrodes, a tape layer of resin including tape wiring patterns on the surface thereof, a plurality of solder bumps for bonding the printed wiring pattern to the tape wiring patterns, leads for connecting the plurality of electrodes of the semiconductor chips to the tape wiring patterns, and seal resin for covering the leads and the plurality of electrodes which are connected by the leads. The elastomer resin has a modulus of transverse elasticity not less than 50 MPa and not more than 750 MPa.

10 Claims, 4 Drawing Sheets

AT HIGH
TEMPERATURES

FIG. 2B

AT LOW
TEMPERATURES

SEMICONDUCTOR DEVICE

BACKGROUND OF THE INVENTION

The present invention relates to a resin sealed type semiconductor device and its mounting structure and in particular to a semiconductor device in which the external size of its package is very approximate to that of the semiconductor chip and its mounting structure.

With an advance in high integration of the semiconductor devices, a technology to provide semiconductor devices in which the size of the package for the semiconductor device is close to that of the chip has been developing. There are two approaches in this technology. One of the approaches is referred to as bare chip mounting in which a semiconductor chip is directly mounted on a printed circuit board (PCB) and is sealed with a resin.

The other approach is generally referred to as CSP (chip size package or chip scale package) in which the package which is resin sealed similarly to prior art is reduced to the size of the chip as small as possible.

A prior art structure of the CSP in which a tape with external terminals is provided on a circuit forming surface of a semiconductor chip so that a flexible material (elastomer resin) is interposed therebetween and the external terminals are electrically connected to the electrodes of the semiconductor chip is disclosed in JP-A-6-504408 (PCT Application) which was filed by Tessera Co., Ltd. Another prior art structure in which a semiconductor chip is mounted on a ceramic substrate having through-holes therein, which is provided on the side opposite to the chip with electrodes and is mounted on a PCB is disclosed in JP-A-6-224259. A further prior art structure of the CPS in which a semiconductor chip is formed on its circuit forming surface with metal wiring patterns, which are provided with external terminals is disclosed in JP-A-6-302604.

SUMMARY OF THE INVENTION

It is object of the present invention to provide a CSP type semiconductor device in which a high reliability is provided by reducing the thermal fatigue of both solder bumps and inner leads.

The external terminals of the CSP include metal bumps which are arrayed in the form of grating and are connected to a PCB. The bumps are most commonly formed of solder. The greatest problem which occurs in the CSP having such a structure is the reliability of connection of solder bumps. If the linear expansion coefficient of a semiconductor chip is largely different from that of a PCB, stress occurs in the bumps with changes in temperature. Repetition of this stress may damage the device due to thermal fatigue.

It is deemed that the semiconductor device disclosed in JP-A-6-504408 is highest in reliability among the prior art structures since it most takes the fatigue damage of the solder into consideration. In this semiconductor device, a tape is provided on a circuit forming surface a semiconductor chip in such a manner that a flexible elastomer resin portion is interposed therebetween and a wiring pattern formed of a metal foil which are continuous to leads are adhered to the tape. The terminals of the leads are bonded to the electrodes of the semiconductor chips. These bonding portions are sealed with a seal resin. Metal bumps are bonded to the wiring patterns and are bonded on the opposite side to wiring patterns formed on a PCB. A mounting structure is thus formed. Since the tape having metal bumps is provided on the circuit forming surface of the semiconductor chip so that the flexible elastomer resin is disposed therebetween in this type of semiconductor device, the difference between the linear expansion coefficient of the semiconductor chip and that of the PCB is absorbed by the shear deformation of the flexible elastomer resin. As a result, no stress is applied to the metal bumps.

However, another problem occurs in this type of semiconductor device due to the fact that the elastomer resin is flexible. The leads which electrically connect the electrodes of the semiconductor chips to the metal bumps extend through the elastomer resin in a depth direction. Accordingly, the fact that the difference between the linear expansion coefficient of the semiconductor chip and that of the PCB is absorbed by the shear deformation of the elastomer resin means that the leads are also similarly deformed. Although the metal bumps have a high reliability, the leads may be broken due to fatigue. Ultimately, this may cause a failure of the semiconductor device.

The bonding portions between the electrodes of the semiconductor device and the leads are sealed with a resin which is flexible as similarly to the elastomer resin. A resin which are flexible, that is, has a low modulus of elasticity generally has a high linear expansion coefficient. The difference between the thermal expansion coefficient of the resin and that of the leads themselves is large. This may cause the leads to be damaged due to thermal fatigue.

The above-mentioned prior art structure type CSP has a problem in either of the reliability of the solder bumps or the reliability of the inner leads and does not have enough reliability as a whole. In accordance with the present invention, a CSP type semiconductor device which overcomes the drawbacks of the prior art CSP and has a high reliability in both solder bumps and inner leads is implemented.

The object of the present invention is achieved by a semiconductor device, comprising semiconductor chips, elastomer resin portion which are bonded to said semiconductor chip excepting at least some of a plurality of electrode of said semiconductor chips, a resin tape layer which is connected to said elastomer resin portion and is provided with wiring patterns on the surface thereof and a plurality of solder bumps which are bonded to the wiring patterns on said resin tape layer, said wiring patterns of said resin tape layer being connected to the plurality of electrodes of said semiconductor chip, connection portions between the wiring patterns of said resin tape layer and the electrodes of said semiconductor chips being sealed with a seal resin, in which the modulus of the elastomer resin portions and the linear expansion coefficient of the lead sealing resin is optimized.

The semiconductor device of the present invention is characterized in that (1) said elastomer resin portion has a modulus of transverse elasticity of not less than 50 MPa and not more than 750 MPa, (2) said elastomer resin portion has a modulus of longitudinal elasticity of not less than 150 MPa and not more than 2250 MPa, or (3) said seal resin has a linear expansion coefficient of not more than $100 \times 10^{-6}/°C$. The mounting structure of the present invention is characterized in that the semiconductor device as defined in any of (1) to (3) is mounted on a PCB of glass cloth epoxy resin.

As mentioned above, in accordance with the present invention, the deformation due to the difference between the linear expansion coefficient of the semiconductor chip and that of the PCB is shared by the elastomer resin portion and the solder bumps in a well balanced manner. Accordingly, stress in both the solder bumps and the inner leads due to changes in temperature can be reduced so that the reliability of the CSP type semiconductor device can be largely enhanced.

DESCRIPTION OF THE PREFERRED EMBODIMENT

Now, the preferred embodiments of the semiconductor device of the present invention will be described with reference to drawings.

Figure 1:
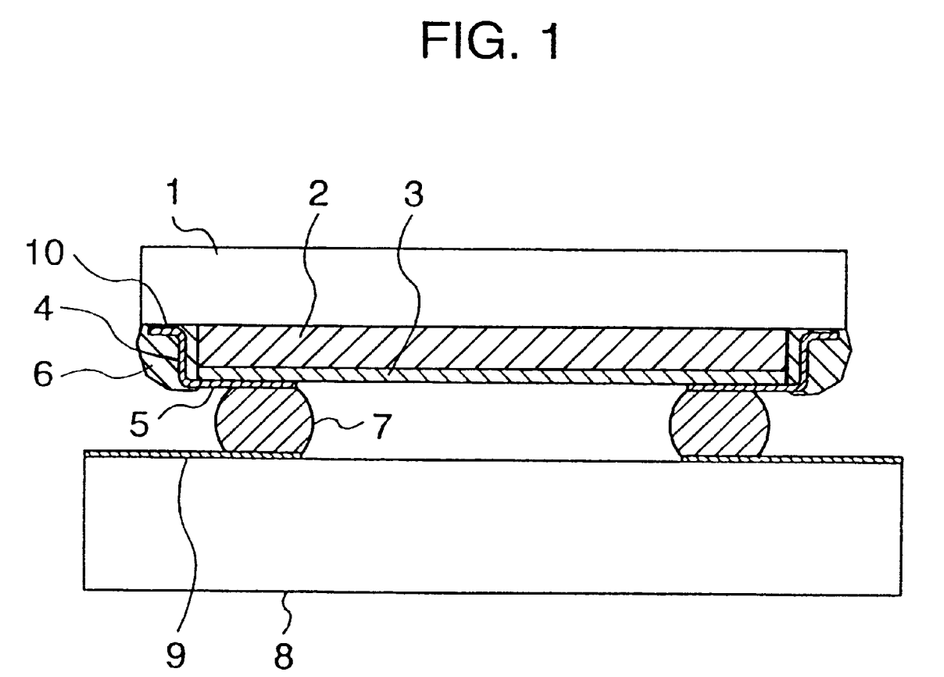
FIG. 1 is a view showing the section of a semiconductor device of a first embodiment of the present invention.

A semiconductor device shown in FIG. 1 which is the first embodiment of the present invention comprises a semiconductor chip 1 which is provided on its circuit forming surface with a tape 3 so that a flexible elastomer resin 2 is interposed therebetween. The tape 3 is formed of a metal foil and a wiring patterns 5 which are continuous to leads 4 are adhered to the tape 3. The leads 4 are bonded at its one end to electrodes 10 of the semiconductor chips 1. The bonds between the leads 4 and the electrodes 10 are sealed with a seal resin 4. Metal bumps 7 are bonded to the wiring patterns 7. The metal bumps 7 are bonded on the side opposite to the wiring patterns 5 to wiring patterns 9 formed on a PCB 8. A mounting structure is formed in such a manner.

Since the tape 3 with the metal bumps 7 is provided on the circuit forming surface of the semiconductor chips 1 in such a manner that the flexible elastomer resin 2 is interposed therebetween in this type of semiconductor, the difference between the linear expansion coefficient between the semiconductor chip 1 and the PCB 8 is absorbed by the shear deformation of the flexible elastomer resin 2 and no stress is resultingly applied to the metal bumps 7.

Figure 2A:
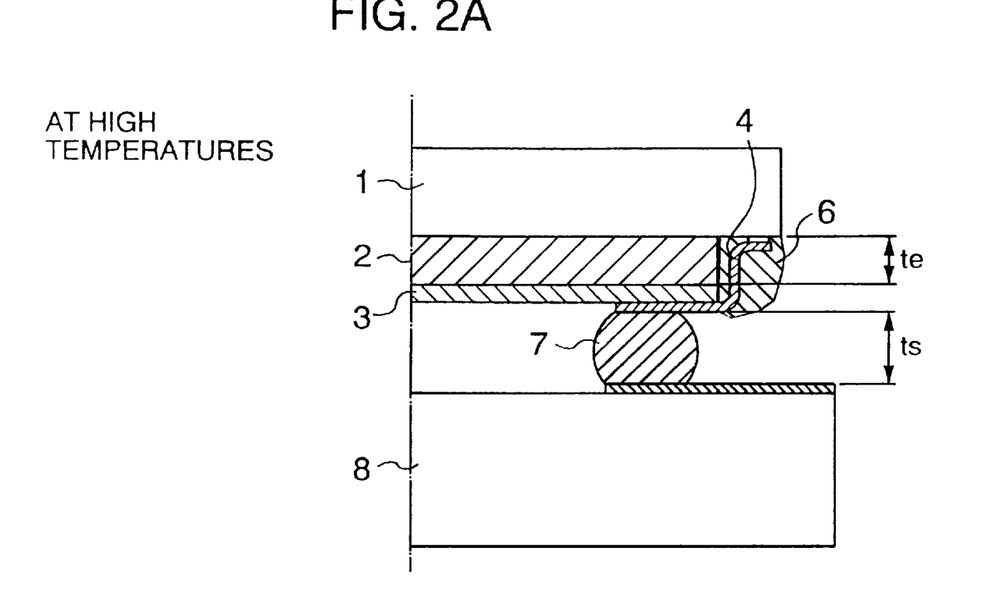
FIGS. 2A and 2B are views for explaining the thermal deformation which occurs in a general CSP type semiconductor device.
Figure 2B:
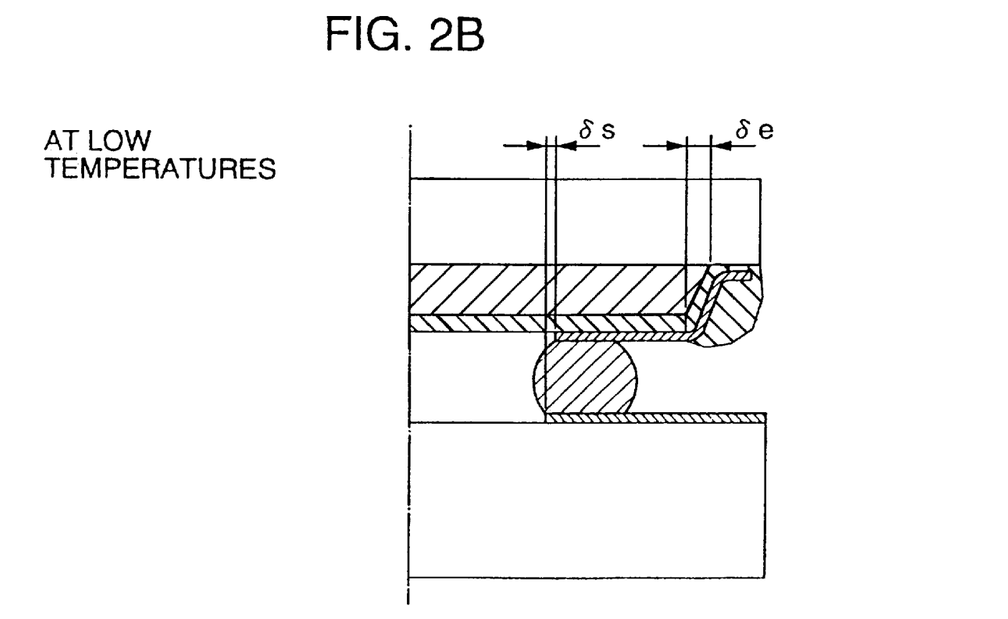

The thermal deformation of CSP shown in FIG. 1 is schematically illustrated in FIGS. 2A and 2B. FIG. 2A is a sectional view illustrating the thermal deformation of CSP at high temperatures. Only right half of the CSP is shown in view of symmetry of the structure. The thickness of the elastomer resin layer 2 and the height of the metal bumps 7 are represented by te and ts. The shape of the CSP which is cooled with reference to that at high temperature is shown in FIG. 2B. Since the linear expansion coefficient of the PCB 8 is larger than that of the semiconductor chips 1, the PCB 8 is thermally contracted larger than the semiconductor chips 1 and relative displacements δe and δs occur between the upper and lower surfaces of the elastomer resin layer 2 and between the upper and lower surfaces of the metal bumps 7 respectively so that respective members sheardeform.

If the deformation of the tape 3 is neglected since the tape 3 is thin, the relative displacement δ between the upper surface of the PCB 8 and the lower surface of the semiconductor chip 1 is represented by the sum of δe and δs.

$$\delta = \delta e + \delta s \tag{1}$$

If the shear stress occurred in the elastomer resin portions 2 and the metal bumps 7 are represented by γe and γs, respectively, they are represented as follows:

$$\gamma e = \delta e / te \tag{2}$$

$$\gamma s = \delta s / ts \tag{3}$$

If the shear strain occurred in the elastomer resin portions 2 is represented by τe, its modulus of transverse elasticity by Ge, the shear stress occurred in the metal bumps 7 by τs, its modulus of transverse elasticity by Gs, following equations are established.

$$\gamma e = \tau e / Ge \tag{4}$$

$$\gamma s = \tau s / Gs \tag{5}$$

If the area on the surface of the elastomer resin portions 2, which is parallel with the semiconductor chip surface is represented by As and the total area of the metal bumps 7 is represented by Ae, the following equations is established due to balance between the shearing forces occurred in the elastomer resin portions 2 and the metal bumps 7.

$$Ae \cdot \tau e = As \cdot \tau s \tag{6}$$

From the equations (1) to (6), the following equation is obtained.

$$Ge = (As \cdot te / Ae) \cdot [1/(\delta/\tau s - ts/Gs)] \tag{7}$$

The relative displacement δ between the upper surface of the PCB 8 and the lower surface of the semiconductor chip 1 is expressed as follows:

$$\delta = \Delta\alpha \cdot \Delta T \cdot L \tag{8}$$

wherein Δα denotes the difference between the linear expansion coefficients of the PCB 8 and the semiconductor chips 1, ΔT denotes a change in temperature and L denotes the distance from the deformation center of the semiconductor device.

The metal bumps 7 are most commonly formed of solder and its height ts is about 0.5 mm. The elastomer resin portion 2 is formed of silicone-rubber and its thickness is about 0.2 mm due to application characteristics. The metal bumps are disposed in the form of grating and its pitch is, for example, 1 mm. Accordingly, the ratio of the area of the elastomer resin portions 2 to that of the metal bumps 7 (Ae/As) is 4. The present invention is applicable even if the pitch is not larger than 1 mm or about 0.5 mm.

The semiconductor chips 1 are formed of monocrystal silicon and has a linear expansion coefficient of $3 \times 10^{-6}/°C$. The PCB is formed of glass epoxy resin and has a linear expansion coefficient of $15 \times 10^{-6}/°C$. Therefore, the difference in coefficient therebetween $\Delta\alpha = 12 \times 10^{-6}/°C$.

The semiconductor devices are required to have such a reliability against the temperature changes that it is durable against 1000 repetitions in the temperature cycling test at −50° C. to 150° C. Experiments which were conducted by present inventors show that in case of solder, the shear stress should be suppressed to not more than 2% in order to endure against 1000 repetitions. This is described in an article of Transactions of the Japan Society of Mechanical Engineers (JSME), volume 50, No. 505, chapter A, page 1709. The shear strain τs at a low temperature of −50° C., which is relevant to this stress is 30 MPa (refer to the above-mentioned article). Accordingly, the modulus of transverse elasticity of the solder in this limit Gs=30/0.02=1500 MPa.

The distance L between the centers of the deformation of the metal bumps 7 and the semiconductor device is a half of the maximum size of the semiconductor chips. Since excessively small semiconductor chips used in CSP can provide no effect inherent in CSP, the chips having a size of 10 mm or more is used. Thus, it is assumed that L=5 mm, $\delta = \Delta\alpha \cdot \Delta T \cdot L = 12 \times 10^{-6} \times 200 \times 5 = 0.0012$ mm from the equation (8). By putting these values into equation (7), we obtain $$Ge = (As \cdot te / Ae) \cdot [1 / (\delta / \tau s - ts / Gs)] \quad (9)$$

$$= (0.2/4) \times [1/(0.012/30 - 0.5/1500)]$$

$$= 750 \ [MPa]$$

If the modulus of transverse elasticity of the elastomer resin portion exceeds 750 MPa, the stress of the solder exceeds 2% so that the device can not endure against the temperature cycling test of 1000 repetitions.

Now, deformation of the leads 4 will be considered. From equations (2) to (5), the ratio of δe to δs is expressed as follows:

$$\delta e/\delta s = (te \cdot As \cdot Gs)/(ts \cdot Ae \cdot Ge) \quad (10)$$

From equations (1) and (10), Ge is expressed as follows:

$$Ge = (\delta/\delta e - 1) \cdot (te \cdot As \cdot Gs)/(ts \cdot Ae) \quad (11)$$

Figure 4:
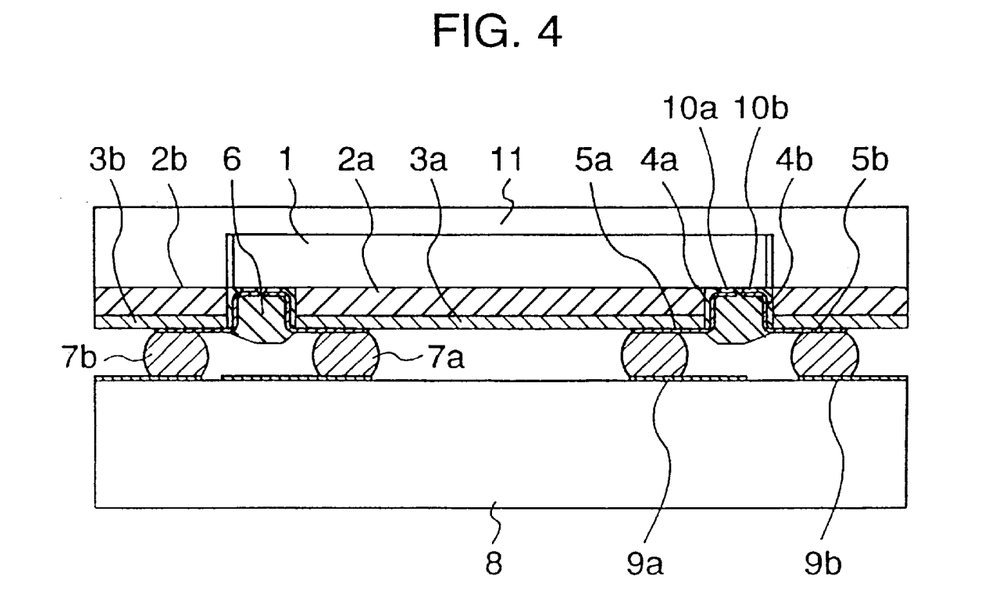
FIG. 4 is a view showing the section of a semiconductor device of a third embodiment of the present invention.

If the lead 4 in FIG. 4 is assumed as columns having opposite ends which are secured to the semiconductor chips 1 and the tape 3, the relative displacement of the leads, that is, the relative displacement between the upper and lower surfaces of the elastomer resin portions 2 is expressed as follows:

$$\delta e = (2 \cdot P \cdot 1^3)/(3 \cdot E1 \cdot I) \quad (12)$$

wherein P denotes a load applied to the root of the leads 4 due to occurrence of relative displacement δe; l is a half of the length of the leads 4; El denotes the modulus of longitudinal elasticity of the lead 4 and I denotes the moment of inertia of area of the leads 4.

The strain σ1 occurred in the leads 4 is expressed as follows:

$$\sigma 1 = P \cdot 1/Z = P \cdot 1 \cdot h/(2 \cdot I) \quad (13)$$

wherein Z denotes the modulus of section and h denotes the thickness of the lead 4.

From equations (12) and (13), $$\delta e = (4 \cdot 1^2 \cdot \sigma 1)/(3 \cdot EI \cdot h) \quad (14)$$

$$= (4 \cdot 1^2 \cdot \varepsilon 1)/(3 \cdot h)$$

wherein 1 denotes a stress occurred in the lead 4. By replacing (11) with (14), we obtain $$Ge = (\delta/\delta e - 1) \cdot (te \cdot As \cdot Gs)/(ts \cdot Ae) \quad (15)$$

$$= \{(3 \cdot h \cdot \delta)/(4 \cdot 1^2 \cdot \varepsilon 1) - 1\} \cdot (te \cdot As \cdot Gs)/(ts \cdot Ae)$$

The leads are generally formed of copper foil. The thickness h of the copper foil adhered to the tape is about 0.03 mm. Since the length of the leads 4 is substantially equal to the thickness te of the elastomer resin 2, 1=te /2=0.1 mm.

Fatigue of the copper foil which forms the leads 4 is disclosed in an article "Preprints of JSME, No. 830-10, page 243. It is found that the stress should be not more than 2% in order for the foil to endure against 1000 repetitions. Accordingly, by using E=0.02 and the same values of parameters in equation (15) as those used in equations (1) to (9), Ge is expressed as follows:

$$Ge = \{(3 \cdot 0.30 \cdot 0.012)/(4 \cdot 0.1 \cdot 0.1 \cdot 0.02) - 1\} \cdot \quad (16)$$

$$(0.2 \cdot 1500)/(0.5 \cdot 4)$$

$$\approx 50 \ [MPa]$$

If the modulus of transverse elasticity of the elastomer resin portions 2 is less than 50 MPa, the stress of the lead 4 exceeds 2%, so that the device can not endure against temperature cycling test of 1000 repetitions.

It is found from the result of the analysis that the reliability of CSP for both of the lead 4 and the metal bumps 7 can be assured by making the modulus of the transverse elasticity not less than 50 MPa and not more than 75 MPa.

The Poisson's ratio of the elastomer resin portions is approximately 0.5. Since there is a relation that the modulus of longitudinal elasticity=2×(1+Poisson's ratio)×the modulus of transverse elasticity, the above-mentioned condition is equivalent to a condition in which the modulus of longitudinal elasticity is not less than 150 MPa and not more than 2250 MPa.

Finally, the material of the seal resin 6 will be considered. If the seal resin 6 which surrounds the leads 4 has approximately the above-mentioned modulus and is hard to some extent and has a linear expansion coefficient which is sufficiently larger than that of the leads, the stress which is substantially same as the thermal expansion of the resin occurs in the leads since the volume of the resin is sufficiently larger than that of the leads. Therefore, the following equation is established.

$$\varepsilon 1 = \alpha p \cdot \Delta T \quad (17)$$

wherein αp denotes the linear expansion coefficient of the seal resin.

As mentioned above, it is necessary to suppress the stress occurred in the leads in the temperature cycle test of temperature difference of 200° C. to not more than 2%. Accordingly, the following equation is established.

$$\alpha p = \varepsilon 1 / \Delta T = 0.02/200 \quad (18)$$

$$= 100 \times 10^{-6} [1/°C.]$$

Therefore, damage to the lead due to thermal fatigue can be prevented in a given temperature cycle test by making the linear expansion coefficient of the seal resin 6 not more than $100 \times 10^{-6}$/°C.

Referring now to FIG. 1, there is shown a sectional view showing a CSP of the first embodiment of the present invention. In this embodiment, the semiconductor chips 1 are provided on the circuit forming surface with the tape layer 3 formed of polyimide in such a manner that the elastomer resin layer 2 is interposed therebetween. Wiring patterns 5 formed of copper foil which are continuous to the leads 4 are adhered to the tape layer 3. The leads 4 are bonded at its one end to the electrodes 10 of the semiconductor chips 1. The bonding portions are sealed with the seal resin 6. In the present invention, the electrodes 10 of the semiconductor chips 1 are disposed along the periphery thereof. Metal bumps 7 are bonded to the wiring patterns 5. The metal bumps are formed of tin-lead eutectic solder. The metal bumps are bonded on its side opposite to the leads 4 to the wiring patterns 9 formed on the PCB 8 formed of glass epoxy resin. A mounting structure is thus formed.

The elastomer resin 2 of the present embodiment is formed of a resin having a modulus of transverse elasticity which is not less than 50 MPa and not more than 750 MPa. The resin having such a modulus includes a resin composition in which 180 parts by weight of molten silica filler is added to 100 parts by weight of silicone resin, a resin composition in which 4.4 parts by weight of curing agent, phenol novolak and 1 part by weight of curing promotor, triphenyl phosphate is added to 100 parts by weight of epoxy modified polybutadiene resin and a material using an epoxy-containing adhesive film. The seal resin 6 is formed of a resin having the same modulus of transverse elasticity as that of the elastomer resin 2 and a linear expansion coefficient less than $100 \times 10^{-6}/°C$. The same resin as the elastomer resin is used for the seal resin 6. An adverse effect on that the properties of the elastomer resin are optimized is eliminated by using a material having a very low modulus, for example, silicone rubber as the seal resin 6. Therefore, the CSP of the present embodiment has a high reliability for both the leads and metal (solder).

The modulus of transverse elasticity of the elastomer resin 2 may be not less than MPa and not more than 750 MPa, preferably around 200 MPa which is a geometric mean of two values. It is a matter of course that the linear expansion coefficient of the seal resin 6 is close to that of the copper, which is $17 \times 10^{-6}/°C$.

It is preferable to appropriately apply a metal coating of nickel, gold and the like on the surface of the leads 4 in order to easily conduct bonding between the electrodes 10 and the bumps 7. It is preferable to make the physical properties of the elastomer resin 2 and the seal resin 6 as close as possible to prevent respective resins from cracking.

Figure 3:
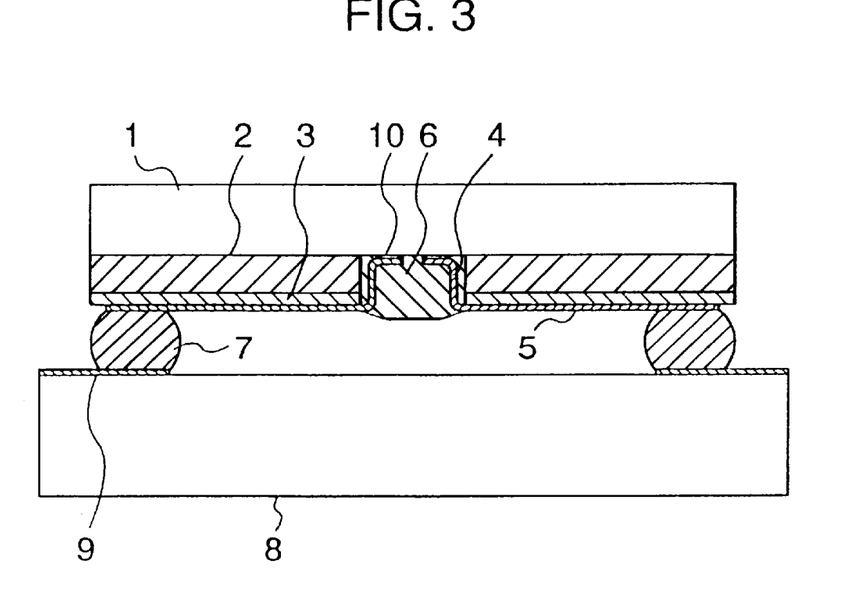
FIG. 3 is a view showing the section of a semiconductor device of a second embodiment of the present invention.

Referring now to FIG. 3, there is shown a sectional view of a CSP of a second embodiment of the present invention. The structure of the present embodiment is substantially identical with that of the first embodiment except that the electrodes 10 of the semiconductor chip 1 are disposed in the center of the semiconductor chip 1.

A resin having a modulus of transverse elasticity not less than 50 MPa and more than 750 MPa is also used for the elastomer resin 2 in the present embodiment. A resin having a modulus of transverse elasticity similar to that of the elastomer resin 2 and a linear expansion coefficient of not more than $100 \times 10^{-6}/°C$. is used for the seal resin 6. Accordingly, the CSP has a high reliability for both the leads and metal (solder). The CSP shown in FIG. 3 is generally used as DRM.

Referring now to FIG. 4, there is shown a sectional view of a third embodiment of a semiconductor device of the present invention. In this embodiment, in order to increase the number of metal bumps than those of the CSP of the first embodiment, the semiconductor chip is bonded to a metallic base 11 and an elastomer resin 2b and a tape 3b are connected to the base 11 on the side facing the circuit board 8 and wiring patterns 5b are further provided which are continuous to the leads 4b which are connected to the electrodes 10b. The wiring patterns 5b are connected to the wiring patterns 9b of the PCB 8 through metal (solder) bumps 7b. If the base 11 is formed of a metal such as Cu, Al and the like, the heat resistance of the package could be reduced since the heat generated by the semiconductor chips 1 are rapidly defused. However, these metals have a linear expansion coefficient which is remarkably higher than that of the semiconductor chips 1. Accordingly, there is the risk that the chips may be damaged in some cases. In order to prevent this, materials having a low linear expansion coefficient such as Fe—Ni alloy, Mo, W may be used. Use of resin substrate such as glass cloth epoxy resin substrate for the base 11 can achieve reduction in weight of package.

A resin having a modulus of transverse elasticity not less than 50 MPa and not more than 750 MPa is also used for the elastomer resin 2a, 2b in the present embodiment. A resin having a modulus of transverse elasticity similar to that of the elastomer resin 2a, 2b and a linear expansion coefficient of not more than $100 \times 10^{-6}/°C$. is used for the seal resin 6. Accordingly, the CSP has a high reliability for both the lead and metal (solder). The CSP shown in FIG. 3 is generally used as DRM.

Although the metal bumps (7a) and (7b) are provided both inside and outside of the face corresponding to the semiconductor chips, respectively, they may be provided only on either side. Although the electrodes 4a ad 4b are shifted in a horizontal direction for easy understanding, they may be aligned along one line in a direction perpendicular to the paper of the drawing. The structure shown in FIG. 4 is excellent also in heat dissipation effect.

Now, a fourth and fifth embodiments of the present invention will be described.

In the first embodiment of FIG. 1, the wiring patterns 5 are disposed on the lower side of the tape 3 and are connected to the metal bumps 7. In practice, the metal bumps 7 are formed of solder. A given area of the tape 3 and the wiring patterns 5 are covered with a solder resist in order to prevent unwanted flowing-out of the fused solder on bonding.

Figure 5:
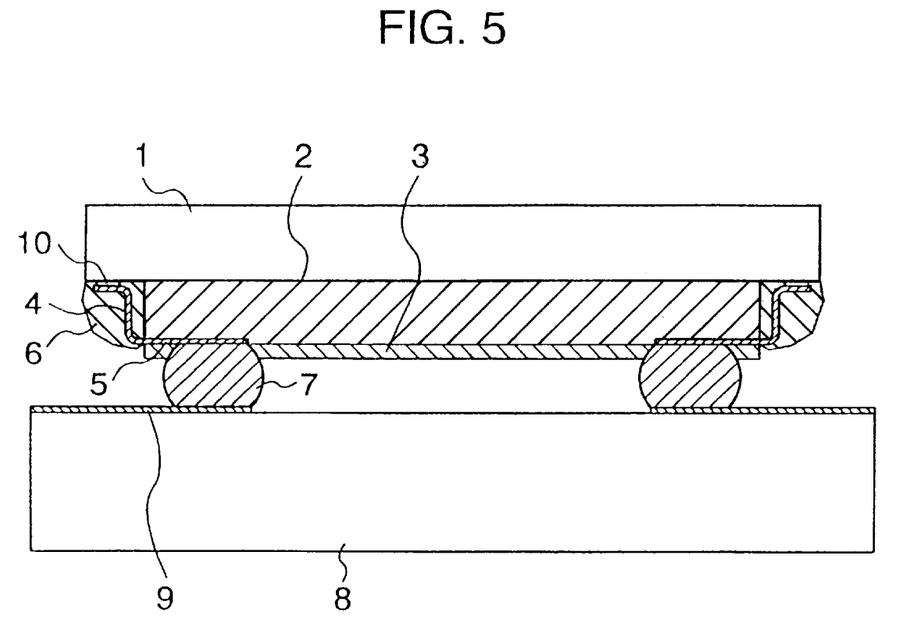
FIG. 5 is a view showing the section of a semiconductor device of a fourth embodiment of the present invention.

The fourth embodiment of the present invention is shown in FIG. 5. In the fourth embodiment, wiring patterns 5 are disposed between the tape 3 and the elastomer resin portion 2. The tape 3 is formed with through-holes, within which the metal bumps 7 are connected to the wiring patterns 5. Although the metal bumps 7 are formed of solder, it is not necessary to cover the tape 3 and the wiring patterns 5 with solder resist since flowing-out of the fused solder on bonding can be prevented by the through-holes formed in the tape 3. Precision of positioning of the metal bumps can be enhanced by provision of the through-holes.

Figure 6:
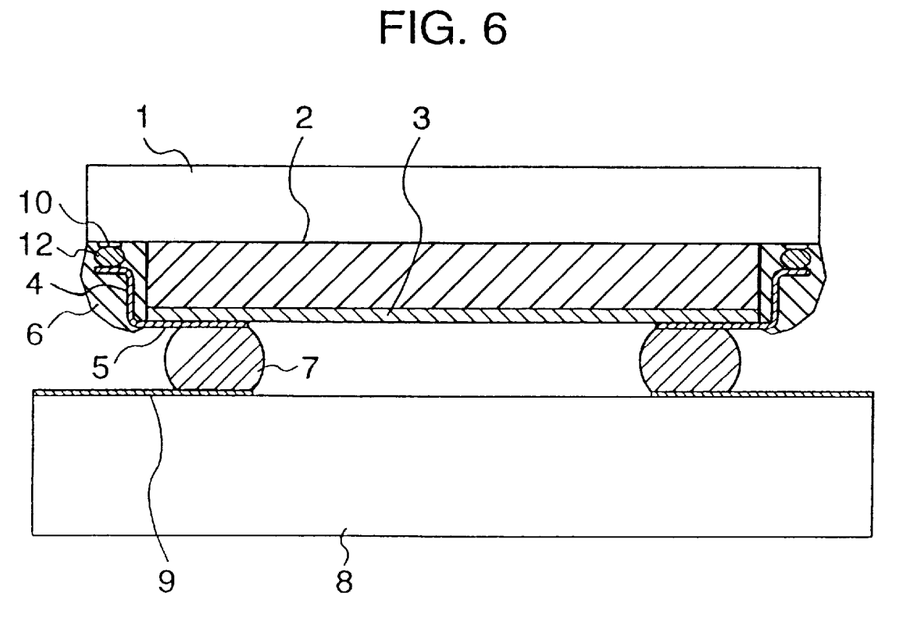
FIG. 6 is a view showing the section of a semiconductor device of a fifth embodiment of the present invention.

The fifth embodiment of the present invention is shown in FIG. 6. In the fifth embodiment, connection between the leads 4 continuous to the wiring patterns 5 and the electrodes 10 of the semiconductor chip 1 is made via metal balls 12. Such a connection method is generally referred to as tape automated bonding method. The metal balls 12 are formed of, for example gold (Au) since the gold is excellent in electric conductivity, pliable and also excellent in bonding ability. Connection of a multiplicity of leads can be achieved simultaneously by using this connection method and reliability of connection can also be enhanced.

What is claimed is:

1. A semiconductor device, comprising semiconductor chips having a plurality of electrodes for external connection;

elastomer resin portions formed of an elastomer resin, which are bonded to said semiconductor chips excepting at least some of said plurality of electrodes;

a tape layer of resin including tape wiring patterns on the surface thereof;

a plurality of solder bumps for bonding said printed wiring patterns to said tape wiring patterns;

leads for connecting said plurality of electrodes of said semiconductor chips to said tape wiring patterns; and seal resin for covering said leads and said plurality of electrodes which are connected by said leads, wherein said elastomer resin has a modulus of transverse elasticity not less than 50 MPa and not more than 750 MPa.

2. A semiconductor device as defined in claim 1 wherein said device is mounted on a printed circuit board made of a glass epoxy resin.

3. A semiconductor device as defined in claim 1 wherein connection between said plurality of electrodes of said semiconductor chips and said tape wiring patterns is conducted by a tape automated bonding method.

4. A semiconductor device, comprising semiconductor chips having a plurality of electrodes for external connection;

elastomer resin portions formed of an elastomer resin, which are bonded to said semiconductor chips excepting at least some of said plurality of electrodes;

a tape layer of resin including tape wiring patterns on the surface thereof;

a plurality of solder bumps for bonding said printed wiring patterns to said tape wiring patterns;

leads for connecting said plurality of electrodes of said semiconductor chips to said tape wiring patterns; and seal resin for covering said leads and said plurality of electrodes which are connected by said leads, wherein said elastomer resin has a modulus of longitudinal elasticity not less than 150 MPa and not more than 2250 MPa.

5. A semiconductor device, comprising semiconductor chips having a plurality of electrodes for external connection;

elastomer resin portions formed of an elastomer resin, which are bonded to said semiconductor chips excepting at least some of said plurality of electrodes;

a tape layer of resin including tape wiring patterns on the surface thereof;

a plurality of solder bumps for bonding said printed wiring patterns to said tape wiring patterns;

leads for connecting said plurality of electrodes of said semiconductor chips to said tape wiring patterns; and seal resin for covering said leads and said plurality of electrodes which are connected by said leads, wherein said elastomer resin has a modulus of transverse elasticity not less than ($12 \times L - 150$) MPa and not more than ($12 \times L - 100$) MPa, wherein L denotes the longitudinal dimension of said semiconductor chips.

6. A semiconductor device, comprising semiconductor chips having a plurality of electrodes for external connection;

elastomer resin portions formed of an elastomer resin, which are bonded to said semiconductor chip excepting at least some of said plurality of electrodes;

a tape layer of resin including tape wiring patterns on the surface thereof;

a plurality of solder bumps for bonding said printed wiring patterns to said tape wiring patterns;

leads for connecting said plurality of electrodes of said semiconductor chips to said tape wiring patterns; and seal resin for covering said leads and said plurality of electrodes which are connected by said leads, wherein said seal resin has a linear expansion coefficient of not more than $100 \times 10^{-6}/°C$.

7. A semiconductor device, comprising semiconductor chips having in the center thereof a plurality of electrodes for external connection;

elastomer resin portions formed of an elastomer resin, which are bonded to said semiconductor chips excepting at least some of said plurality of electrodes;

a tape layer of resin including tape wiring patterns on the surface thereof;

a plurality of solder bumps for bonding said printed wiring patterns to said tape wiring patterns;

leads for connecting said plurality of electrodes of said semiconductor chips to said tape wiring patterns; and seal resin for covering said leads and said plurality of electrodes which are connected by said leads.

8. A semiconductor device, comprising;

semiconductor chips having a plurality of electrodes for external connection;

a first elastomer resin portion formed of an elastomer resin, which is bonded to said semiconductor chip excepting at least some of said plurality of electrodes;

a first resin tape layer having second tape wiring pattern on the surface thereof, which are connected to said first elastomer resin portion;

a base into which said semiconductor chip is adapted for securing the same;

a second elastomer resin portion formed of an elastomer resin, which is bonded to said base;

a second resin tape layer having second tape wiring patterns on the surface thereof, which is bonded to said second elastomer resin portion;

a plurality of solder bumps for bonding said printed wiring patterns to said first tape wiring patterns and for bonding said printed wiring patterns to said second wiring patterns;

first leads for connecting said plurality of electrodes of said semiconductor chips to said first tape wiring pattern;

second leads for connecting said plurality of said semiconductor chips to said second tape wiring pattern; and a seal resin for covering said first and second leads and said plurality of electrodes which are connected by said first and second lead.

9. A semiconductor device, comprising semiconductor chips having a plurality of electrodes for external connection;

elastomer resin portions formed of an elastomer resin, which are bonded to said semiconductor chip excepting at least some of said plurality of electrodes;

a resin tape layer including tape wiring patterns on the surface facing said elastomer resin portions and having therein through-holes extending into at least part of said tape wiring patterns;

a plurality of solder bumps formed in said through-holes for bonding said printed wiring pattern to said tape wiring pattern;

leads for connecting said plurality of electrodes of said semiconductor chip to said tape wiring patterns; and seal resin for covering said leads and said plurality of electrodes which are connected by said leads.

10. A semiconductor device, comprising semiconductor chips having a plurality of electrodes for external connection;

elastomer resin portions formed of an elastomer resin, which are bonded to said semiconductor chip excepting at least some of said plurality of electrodes;

a tape layer of resin including tape wiring patterns on the surface thereof;

a plurality of solder bumps for bonding said printed wiring patterns to said tape wiring patterns;

metal balls formed of gold on said plurality of electrodes of said semiconductor chips;

leads for connecting said plurality of electrodes of said semiconductor chips to said tape wiring patterns through said metal balls; and seal resin for covering said leads, said plurality of electrodes which are connected by said leads and said metal balls.

* * * * *